United States Patent [19]

Bynum et al.

[11] Patent Number: 4,577,211

[45] Date of Patent: Mar. 18, 1986

[54] INTEGRATED CIRCUIT AND METHOD FOR BIASING AN EPITAXIAL LAYER

[75] Inventors: Byron G. Bynum; David L. Cave, both of Tempe, Ariz.

[73] Assignee: Motorola, Inc., Schaumburg, Ill.

[21] Appl. No.: 596,120

[22] Filed: Apr. 2, 1984

[51] Int. Cl.[4] .......................... H01L 29/72; H03K 3/26
[52] U.S. Cl. .......................................... 357/34; 357/35; 357/48; 357/51; 307/303; 307/299 R; 307/296 R
[58] Field of Search ....................... 357/48, 34, 35, 51; 307/303, 296 R, 299 R

[56] References Cited

U.S. PATENT DOCUMENTS 3,829,709  8/1974  Maigret et al. ..................... 357/48

OTHER PUBLICATIONS

Davis, W. F., "Bipolar . . . Environment", *IEEE Journal of Solid-State Circuits*, vol. Sc-8, No. 6, Dec., 1973, pp. 419-427.

*Primary Examiner*—Andrew J. James
*Assistant Examiner*—Jerome Jackson, Jr.
*Attorney, Agent, or Firm*—William J. Kubida; Dale E. Jepsen

[57] ABSTRACT

An integrated circuit and method for biasing an impurity region, in particular an epitaxial layer, to a level substantially equal to a supply voltage level yet exhibiting a high reverse breakdown voltage to negative transients of the supply voltage. The integrated circuit and method is of especial utility in power BIMOS and other applications having the substrate at or near the supply voltage level.

12 Claims, 9 Drawing Figures

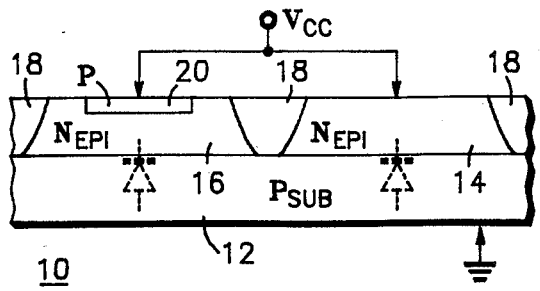
FIG. 1 —PRIOR ART—
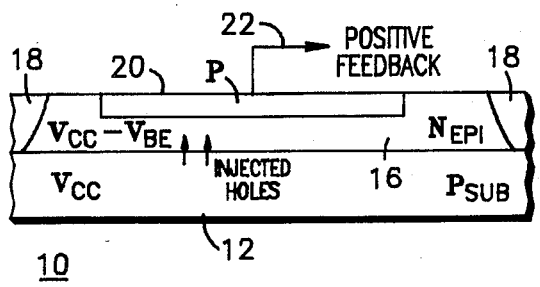
FIG. 2 —PRIOR ART—
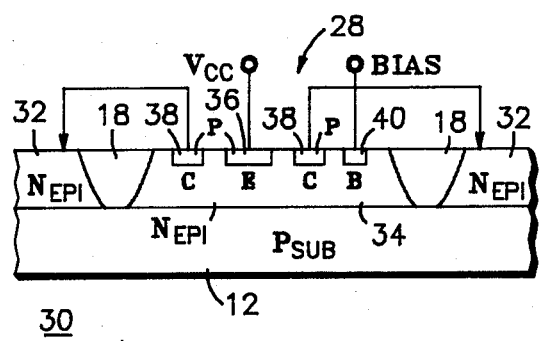 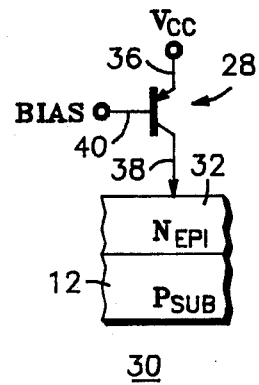
FIG. 3A     FIG. 3B
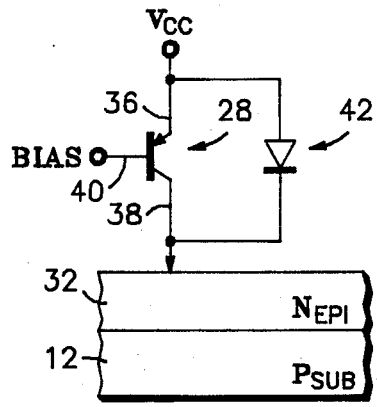 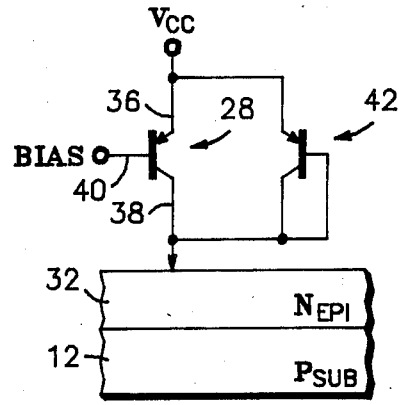
FIG. 4A     FIG. 4B

—PRIOR ART—

INTEGRATED CIRCUIT AND METHOD FOR BIASING AN EPITAXIAL LAYER

BACKGROUND OF THE INVENTION

The present invention relates, in general, to an integrated circuit and method for biasing an impurity region of an integrated circuit structure. More particularly, the present invention relates to an integrated circuit and method for biasing an epitaxial (EPI) layer to a level substantially equal to a supply voltage ($V_{CC}$) level yet exhibiting a high reverse breakdown voltage to negative transients of the $V_{CC}$ supply.

Traditionally, the accepted method for biasing EPI tubs in bipolar integrated circuits is by connecting them directly to $V_{CC}$. However, many integrated circuit applications experience negative transient voltages on the $V_{CC}$ supply line. For example, in some automotive applications, transients of up to ±125 volts may be experienced with source impedances as low as 10 ohms. Similarly, industrial atmospheres, robotics applications and other integrated circuit environments having relatively long supply lead lengths may experience such negative voltage transients.

With negative transient voltages on the $V_{CC}$ line, direct biasing of the EPI tubs may result in a forward biased diode from the P type substrate, which is nominally tied to a circuit ground potential, to the EPI region. Large negative voltage transients on the $V_{CC}$ line may therefore result in the destruction of the EPI substrate junction or interconnecting metallization.

One previously utilized method for dealing with negative voltage transients has been to eliminate the possibility of current flow in this forward biased diode from the EPI substrate junction by application of $V_{CC}$ to a P region to provide a high reverse breakdown voltage diode from $V_{CC}$ to the EPI region. In many applications, however, it is necessary that the EPI regions be held at a voltage less than one diode voltage from $V_{CC}$ for example, in power BIMOS circuits where the substrate is essentially $V_{OUT}$ and may go as high as the level of $V_{CC}$. Such circuits may be susceptible to latching should the substrate go to $V_{CC}$ and inject holes into an EPI region biased below $V_{CC}$ when a signal path P region within the EPI collects. Latching will occur if this P region collecting has positive phase to the output, that is, collected current turns on the output forcing the substrate to a higher level.

SUMMARY OF THE INVENTION

It is therefore an object of the present invention to provide an improved integrated circuit and method for biasing an epitaxial layer.

It is further an object of the present invention to provide an improved integrated circuit and method for biasing an epitaxial layer which is readily fabricated utilizing a minimum of on-chip area.

It is still further an object of the present invention to provide an improved integrated circuit and method for biasing an epitaxial layer to a level substantially equal to $V_{CC}$ yet having a very high reverse breakdown voltage to negative voltage transients on $V_{CC}$.

The foregoing and other objects are achieved in the present invention wherein there is provided an integrated circuit and method including a circuit for biasing a first portion of an impurity region of the integrated circuit to a voltage level substantially equal to a supply voltage level while having a high reverse breakdown voltage to negative transients of the supply voltage level. A contact transistor is formed within a second, isolated portion of the impurity region of the integrated circuit and has first, second and third contact leads thereto, the first contact lead being coupled to a supply voltage line, the second contact lead being coupled to a bias voltage line and the third contact lead being connected to the first portion of the impurity region. An integrated circuit and method in accordance with the present invention may further comprise a shunt diode having anode and cathode terminals thereof, the anode and cathode terminals being respectively connected to the first and third contact leads of the contact transistor. In certain embodiments, in accordance with the present invention, the shunt diode comprises a shunt transistor having respective first, second and third shunt leads thereto, the first shunt lead forming the anode terminal and the second and third shunt leads being common connected to form the cathode terminal.

BRIEF DESCRIPTION OF THE DRAWINGS

The above mentioned and other features and objects of the invention and the manner of attaining them will become more apparent and the invention itself will be best understood by reference to the following description of an embodiment of the invention taken in conjunction with the accompanying drawings, wherein:

FIG. 1 is a simplified cross-sectional view of an integrated circuit illustrating two prior art techniques for biasing an epitaxial layer;

FIG. 2 is a simplified cross-sectional view of an integrated circuit illustrating the latching problems inherent in a prior art device in accordance with a portion of FIG. 1 having its substrate at $V_{CC}$, an EPI region at $V_{CC}$-$V_{BE}$ and a signal path P region acting as a collector;

FIGS. 3A and 3B are a simplified cross-sectional view and partial schematic representation respectively of a biasing circuit in accordance with the present invention illustrating the biasing of an impurity region, for example, an epitaxial layer by means of a saturated PNP current source functioning as a contact transistor;

FIGS. 4A and 4B are partial schematic and cross-sectional views of a portion of an integrated circuit in accordance with the present invention illustrating the addition of a high voltage diode, in particular, a PNP diode in parallel with the saturated PNP current source of FIGS. 3A and 3B;

DESCRIPTION OF A PREFERRED EMBODIMENT

Figure 5:
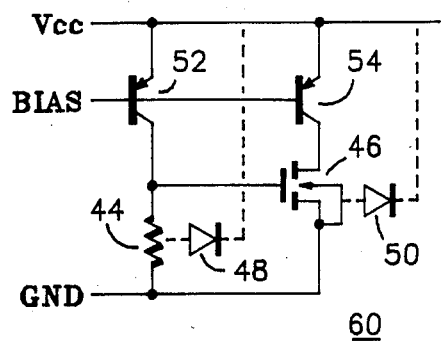
FIG. 5 is a schematic illustration of a portion of a prior art BIMOS circuit illustrating the diodes formed between a P type resistor and DMOS device wells coupled to ground formed in an epitaxial layer coupled to a supply voltage, $V_{CC}$, which might under certain circumstances, experience a negative voltage transient.

With reference to FIG. 1, a portion of a prior art integrated circuit 10 is shown. Integrated circuit 10 comprises, in major part, P substrate 12 and N epitaxial layers 14, 16 separated by a plurality of isolation regions 18. A P region 20 is disposed within N epitaxial layer 16. A source of supply voltage $V_{CC}$ is applied directly to N epitaxial layer 14 and P region 20. P substrate 12 is connected to circuit ground.

The usual method of biasing EPI tubs in bipolar integrated circuits is by connecting the epitaxial layer directly to $V_{CC}$. This is shown by the connection of N epitaxial layer 14 to a supply voltage $V_{CC}$. However, should a negative transient appear on $V_{CC}$ with N epitaxial layer 14 connected directly thereto while P substrate 12 is connected to circuit ground, a forward biased diode will result at the interface of N epitaxial layer 14 with P substrate 12. Large negative voltage transients will then result in destruction of the junction between N epitaxial layer 14 and P substrate 12 or, could possibly adversely impact any interconnecting metallization used in integrated circuit 10.

With a view towards eliminating the possibility of this forward biased diode, P region 20 could serve as a high reverse breakdown diode to the supply voltage $V_{CC}$. Thus, N epitaxial layer 16 will be tied to the supply voltage $V_{CC}$ through P region 20 resulting in a PN diode which is reverse biased to negative transients of $V_{CC}$.

Referring additionally now to FIG. 2, the use of P region 20 in applications where it is necessary that N epitaxial layer 16 be held very near the level of $V_{CC}$ is shown. In the portion of integrated circuit 10 herein shown, P substrate 12 is at the level of $V_{CC}$ such as would be the case in power BIMOS and other devices in which the substrate is at or near $V_{CC}$ and functions as $V_{OUT}$. In the embodiment of FIG. 2, similar structure to that above described with respect to FIG. 1 is similarly numbered and the foregoing description thereof will suffice herefor.

With respect to that portion of integrated circuit 10 shown in FIG. 2, such structure may be susceptible to latching if P substrate 12 is at or near the supply voltage level $V_{CC}$ and holes are injected into N epitaxial layer 16 which is then one $V_{BE}$ below $V_{CC}$ and a signal path is established wherein P region 20 functions as a collector of a PNP transistor. Latching will occur if P region 20 collecting exhibits positive phase with respect to the output $V_{OUT}$. That is, collected current turns on the output forcing P substrate 12 to a higher level. In this manner, P region 20 can supply a collected current output 22 from substrate 12 in the signal path as positive feedback.

Referring additionally now to FIGS. 3A and 3B, a portion of an integrated circuit 30 is shown in accordance with the present invention in which a reverse biased high voltage diode is maintained yet an epitaxial region may be at a voltage level close to $V_{CC}$. Integrated circuit 30 comprises, in pertinent part, a P substrate 12 and N epitaxial layers 32, 34 separated by a plurality of isolation regions 18. A PNP transistor 28, functioning as a contact transistor, is formed within N epitaxial layer 34, and in the embodiment shown, comprises a multi-collector saturated device having collectors 38, an emitter 36 connected to $V_{CC}$ and a base 40 connected to a source of bias voltage. Collectors 38 are utilized to bias N epitaxial layers 32. Although PNP transistor 28 resides in N epitaxial layer 34 which is maintained at a level of one $V_{BE}$ below $V_{CC}$ no problem is presented as above described because a high substrate injection results in collectors 38 collecting even more current to bias the associated N epitaxial layers 32.

Referring additionally now to FIGS. 4A and 4B, an alternative embodiment to provide biasing to N epitaxial layers 32 is shown. In this embodiment, PNP transistor 28 which is functioning as a saturated PNP current source has an additional diode 42 connected in parallel therewith. Diode 42 is shown schematically as having its anode connected to emitter 36 and its cathode connected to one of collectors 38. In practice, diode 42 may be a PNP transistor having its emitter common connected with emitter 36 and its base and collector common connected with one of collectors 38. Diode 42 may be useful due to the fact that under transient conditions, the current through N epitaxial layer 32 may become larger than the normal leakage current and the collector 38 of PNP transistor 28 may be unable to supply the necessary current wherein a latch condition may develop. In order to avoid this possible situation, both PNP transistor 28 and diode 42 may be utilized to bias N epitaxial layer 32.

Additionally, in the circuit "off" state, i.e. when P substrate 12 is low, it may be desirable to turn off the bias line, which, without diode 42 would leave N epitaxial layer 32 floating. Under such conditions, when the circuit is enabled, P substrate 12 might rise faster than the bias line and create a latch condition. Diode 42 functions to hold N epitaxial layer 32 high thereby avoiding a floating condition.

Referring additionally now to FIG. 5, a portion of a prior art BIMOS circuit 60 is shown. For illustrative purposes, BIMOS circuit 60 is shown as comprising a series connected resistor 44 and current source 52 coupled between ground and $V_{CC}$. Similarly, a MOSFET 46 is connected in series with current source 54 between ground and $V_{CC}$. The gate of MOSFET 46 is connected between current source 52 and resistor 44. Current sources 52 and 54, shown as PNP transistors, have their emitter terminals connected to $V_{CC}$ and their collector terminals respectively connected to resistor 44 and MOSFET 46. The base terminals of current sources 52, 54 are connected to a source of bias voltage. Also illustrated are parasitic diodes 48, 50 from the P type resistor 44 and MOSFET 46 well respectively to an N type epitaxial layer. This N type epitaxial layer is shown as connected to $V_{CC}$.

In operation, if the supply voltage $V_{CC}$ experienced a negative transient, then it is possible that parasitic diodes 48, 50 would become forward biased into the epitaxial layer such that large currents could flow. Thus, it is possible that the P well of MOSFET transistor 46 as well as the P region of resistor 44 which are both tied to ground, could forward bias parasitic diodes 48 and 50 from ground to $V_{CC}$ when $V_{CC}$ went negative.

Figure 6:
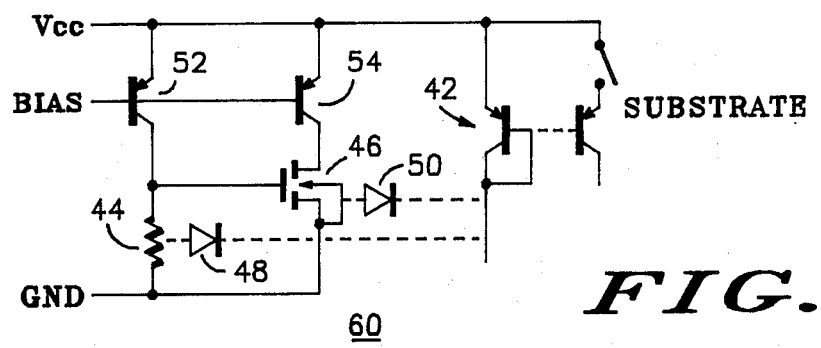
FIG. 6 is a schematic representation of the BIMOS circuit of FIG. 5 showing the coupling of the epitaxial layer containing a resistor and DMOS device to $V_{CC}$ through a high voltage diode when the substrate is at $V_{CC}$, as shown by a switched PNP transistor.

Referring additionally now to FIG. 6, a further extension of BIMOS circuit 60 of FIG. 5 is shown. In this application, a diode 42, which is shown as a PNP transistor having its base connected to its collector, couples the cathodes of parasitic diodes 48 and 50 to $V_{CC}$. In this manner, a reverse biased diode serves to protect the epitaxial layer in which resistor 44 and MOSFET 46 are formed from negative voltage transients of $V_{CC}$. However, as previously described with respect to FIG. 2 in particular, problems could develop when the substrate of BIMOS circuit 60 is at $V_{CC}$ as shown by means of a switched PNP transistor. The emitter of this transistor is the substrate, the base is any EPI region a $V_{BE}$ below the emitter and the collector is any P region within the EPI. Should the substrate go as high as $V_{CC}$, when an epitaxial layer is at a level of $V_{CC}$-$V_{BE}$, the substrate will then forward bias from the substrate to the epitaxial layer and any P regions, such as resistor 44 or the P well of MOSFET 46 could become collectors for the substrate to EPI current. This problem is inherent due to the use of diode 42 placing the EPI at a $V_{BE}$ below $V_{CC}$ when it is possible that the substrate itself might be at a level equal to $V_{CC}$ as shown.

Figure 7:
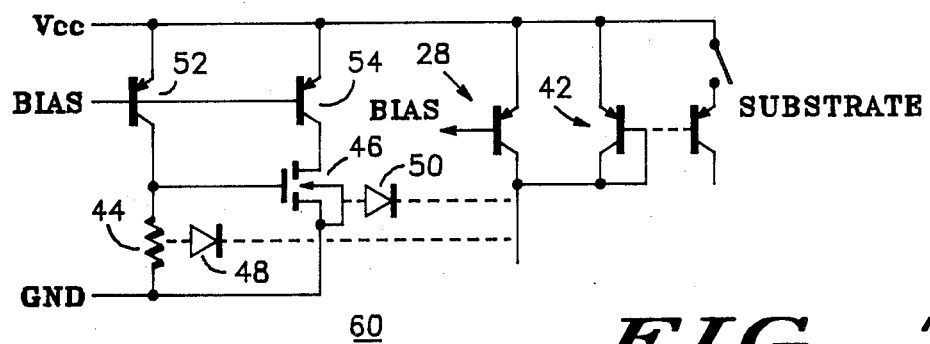
FIG. 7 is a further schematic representation of the BIMOS circuit of FIG. 6 showing the coupling of the epitaxial layer containing a resistor and DMOS device to $V_{CC}$ through a saturated PNP current source functioning as a contact transistor and high voltage diode when the substrate is at $V_{CC}$, as shown by a switched PNP transistor.

Referring additionally now to FIG. 7, BIMOS circuit 60 is shown having its epitaxial layer biased in accordance with the present invention. In this extension of FIGS. 5 and 6, diode 42 is paralleled with a saturated PNP current source acting as a contact transistor comprising PNP transistor 28. Under normal operation, when PNP transistor 28 turns on, the voltage applied to the epitaxial layer is pulled within a saturation voltage of $V_{CC}$. Diode 42 then, in effect, is not a factor. Resultantly, the substrate PNP device comprising the substrate, epitaxial layer and any P region can't turn on because when the substrate is at $V_{CC}$ the epitaxial layer is not down 1 $V_{BE}$. In practice, the epitaxial layer is below $V_{CC}$ by approximately 100 to 200 millivolts. Moreover, should $V_{CC}$ go negative, PNP transistor 28 reverse biases and turns off. Since it is a high voltage transistor, it presents a high breakdown voltage in the reverse direction should $V_{CC}$ go negative. Diode 42 would function in case of a transient phenomenon which might occur if there is more current demanded by the epitaxial layer than the current source can handle. Therefore, diode 42 in parallel with PNP transistor 28 insures that the voltage can never go lower than 1 $V_{BE}$. Should the epitaxial layer approach a level lower than 1 $V_{BE}$ below $V_{CC}$, diode 42 will forward bias and supply the necessary amount of current. Moreover, when no bias is applied to PNP transistor 28, diode 42 will function to hold the epitaxial layers up within one $V_{BE}$ of $V_{CC}$.

What has been provided therefore is an improved integrated circuit and method for biasing an epitaxial layer which is readily fabricated utilizing a minimum of on-chip area. The integrated circuit and method of the present invention provides a means for biasing an epitaxial layer close to a supply voltage level $V_{CC}$ yet exhibiting a high reverse breakdown voltage to negative voltage transients on $V_{CC}$.

While there have been described above the principles of the invention in conjunction with specific apparatus, it is to be clearly understood that this description is made only by way of example and not as a limitation to the scope of the invention.

We claim:

1. A circuit for biasing a first portion of an impurity region of an integrated circuit to a voltage level substantially equal to a supply voltage level comprising:
   a contact transistor formed within a second isolated portion of said impurity region and having first, second and third contact leads thereto, said first contact lead being coupled to a supply voltage line, said second contact lead being coupled to a bias voltage line and said third contact lead being connected to said first portion of said impurity region; and
   a shunt diode having anode and cathod terminals thereof, said anode and cathod terminals being respectively connected to said first and third contact leads of said contact transistor.

2. The biasing circuit of claim 1 wherein said diode comprises a shunt transistor having respective first, second and third shunt leads thereto, said first shunt lead forming said anode terminal and said second and third shunt leads being common connected to form said cathode terminal.

3. The biasing circuit of claim 1 wherein said impurity region is an epitaxial layer.

4. The biasing circuit of claim 1 wherein said contact transistor is a PNP bipolar device.

5. The biasing circuit of claim 2 wherein said shunt transistor is a PNP bipolar device.

6. A method for biasing a first portion of an impurity region of an integrated circuit to a voltage level substantially equal to a supply voltage level while having a high reverse breakdown voltage to negative transients of said supply voltage level comprising the steps of:
   forming a contact transistor within a second isolated portion of said impurity region having first, second and third contact leads thereto;
   firstly coupling said first contact lead to a supply voltage line;
   secondly coupling said contact lead to a bias voltage line;
   connecting said third contact lead to said first portion of said impurity region; and
   providing a shunt diode having anode and cathode terminals thereof, said anode and cathode terminals being connected to said first and third contact leads of said contact transistor.

7. The method of claim 6 wherein said step of providing is carried out by means of a shunt transistor having respective first, second and third shunt leads thereto, said first shunt lead forming said anode terminal and said second and third shunt leads being common connected to form said cathode terminal.

8. An integrated circuit including a circuit for biasing a first portion of an impurity region of said integrated circuit to a voltage level substantially equal to a supply voltage level while having a high reverse breakdown voltage to negative transients of said supply voltage level comprising:
   a contact transistor formed within a second isolated portion of said impurity region of said integrated circuit and having first, second and third contact leads thereto, said first contact lead being coupled to a supply voltage line, said second contact lead being coupled to a bias voltage line and said third contact lead being connected to said first portion of said impurity region; and
   a shunt diode having anode and cathode terminals thereof, said anode and cathode terminals being respectively connected to said first and third contact leads of said contact transistor.

9. The integrated circuit of claim 8 wherein said diode comprises a shunt transistor having respective first, second and third shunt leads thereto, said first shunt lead forming said anode terminal and said second and third shunt leads being common connected to form said cathode terminal.

10. The integrated circuit of claim 8 wherein said impurity region is an epitaxial layer.

11. The integrated circuit of claim 8 wherein said contact transistor is a PNP bipolar device.

12. The integrated circuit of claim 9 wherein said shunt transistor is a PNP bipolar device.

* * * * *